United States Patent
Kato et al.

(10) Patent No.: US 9,800,210 B2
(45) Date of Patent: Oct. 24, 2017

(54) POWER AMPLIFIER INCLUDING A PLURALITY OF FET CELLS CONNECTED IN PARALLEL

(71) Applicant: Mitsubishi Electric Corporation, Tokyo (JP)

(72) Inventors: Katsuya Kato, Tokyo (JP); Naoki Kosaka, Tokyo (JP); Eri Fukuda, Tokyo (JP); Shigeru Fujiwara, Tokyo (JP); Atsushi Okamura, Tokyo (JP); Kenichiro Chomei, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/249,680

(22) Filed: Aug. 29, 2016

(65) Prior Publication Data

US 2017/0207753 A1    Jul. 20, 2017

(30) Foreign Application Priority Data

Jan. 15, 2016 (JP) .................... 2016-006192

(51) Int. Cl.
| | |
|---|---|
| *H03F 3/68* | (2006.01) |
| *H03F 1/30* | (2006.01) |
| *H03F 3/195* | (2006.01) |
| *H03F 3/213* | (2006.01) |

(52) U.S. Cl.
CPC ............. *H03F 1/30* (2013.01); *H03F 3/195* (2013.01); *H03F 3/213* (2013.01); *H03F 2200/451* (2013.01)

(58) Field of Classification Search
CPC ......... H03F 3/16; H03F 3/68; H03F 2200/447
USPC ....................... 330/277, 289, 295
See application file for complete search history.

(56) References Cited

U.S. PATENT DOCUMENTS

| | | | |
|---|---|---|---|
| 6,018,270 A * | 1/2000 | Stuebing | H03D 7/1433 330/134 |
| 6,046,481 A | 4/2000 | Ishikura et al. | |
| 6,329,879 B1 | 12/2001 | Maruyama et al. | |
| 2007/0222033 A1 | 9/2007 | Ariie et al. | |
| 2011/0018639 A1 | 1/2011 | Matsuzuka et al. | |

FOREIGN PATENT DOCUMENTS

| | | |
|---|---|---|
| JP | Hei08-032087 A | 2/1996 |
| JP | Hei11-297941 | 10/1999 |
| JP | 2000-209038 | 7/2000 |

(Continued)

*Primary Examiner* — Steven J Mottola
(74) *Attorney, Agent, or Firm* — Studebaker & Brackett PC

(57) ABSTRACT

A power amplifier includes: a plurality of FET cells connected in parallel to each other; a plurality of first resistors connected between gate terminals of the plurality of FET cells and grounding terminals respectively; a plurality of second resistors having one ends connected to the gate terminals of the plurality of FET cells respectively and other ends connected to each other; a plurality of capacitors connected in parallel to the plurality of second resistors respectively; and a third resistor connected between a connection point of the other ends of the plurality of second resistors and a power supply terminal, wherein the first resistors have temperature coefficients of resistance greater than those of the second and third resistors and are arranged closer to the corresponding FET cells than the third resistor.

4 Claims, 4 Drawing Sheets

(56) References Cited

FOREIGN PATENT DOCUMENTS

| | | |
|---|---|---|
| JP | 2000-349563 A | 12/2000 |
| JP | 2011-030006 A | 2/2011 |
| JP | 2013-207408 A | 10/2013 |
| WO | 2006/057104 A1 | 6/2006 |

* cited by examiner

POWER AMPLIFIER INCLUDING A PLURALITY OF FET CELLS CONNECTED IN PARALLEL

BACKGROUND OF THE INVENTION

Field

The present invention relates to a power amplifier capable of suppressing thermal runaway even when a plurality of FET cells are connected in parallel.

Background

Power amplifiers used for radio communication or the like are required to operate stably over a wide range of ambient temperatures. Furthermore, operating power exceeding 40 W is required for mobile communication base stations, and since large power is consumed at power amplifiers, it is particularly important that the power amplifiers should operate stably even at high temperatures.

With FETs often used for power amplifiers, the source is grounded, a negative voltage is applied to the gate terminal and a positive voltage is applied to the drain terminal. A drain current is controlled by a gate voltage, and as the gate voltage increases, the drain current also increases. With actual devices, a leakage current flows backward from the gate terminal, often causing thermal runaway at high temperatures.

A mechanism of thermal runaway is as follows. Since the gate leakage current increases as the operating temperature increases, the gate voltage at the gate terminal increases at high temperatures and the drain current increases. As a result, power consumption at the FET increases, causing the power amplifier to fall into a state in which positive feedback is established with the amount of heat generated increasing and the operating temperature increasing. For this reason, there is a demand for preventing thermal runaway during high temperature operation and it is preferable that a compensation circuit be provided in the power amplifier for downsizing of a transceiver.

In response to such requirements, there is a proposal to use a resistor with a large temperature coefficient for a resistor connected between a gate terminal and a grounding terminal in a bias circuit that supplies a gate bias obtained by dividing a supply voltage by two resistors in a conventional power amplifier (e.g., see JP 2000-349563 A). Since a resistance value of the resistor increases at a high temperature, a voltage applied to the gate terminal decreases. Therefore, it is possible to suppress an increase in a drain current due to an increase in a gate leakage current at a high temperature and thereby suppress thermal runaway.

SUMMARY

With a power amplifier in which a plurality of FET cells are connected in parallel, operating temperatures vary depending on the positions of the FET cells due to low heat dissipation of FET cells arranged in the vicinity of the center. For this reason, the prior art involves a problem of reducing the effect of suppressing thermal runaway.

The present invention has been implemented to solve the above-described problem and it is an object of the present invention to provide a power amplifier capable of suppressing thermal runaway even when a plurality of FET cells are connected in parallel.

According to the present invention, a power amplifier includes: a plurality of FET cells connected in parallel to each other; a plurality of first resistors connected between gate terminals of the plurality of FET cells and grounding terminals respectively; a plurality of second resistors having one ends connected to the gate terminals of the plurality of FET cells respectively and other ends connected to each other; a plurality of capacitors connected in parallel to the plurality of second resistors respectively; and a third resistor connected between a connection point of the other ends of the plurality of second resistors and a power supply terminal, wherein the first resistors have temperature coefficients of resistance greater than those of the second and third resistors and are arranged closer to the corresponding FET cells than the third resistor.

In the present invention, the first resistors having greater temperature coefficients of resistance than the second and third resistors are connected between the gate terminals of the plurality of FET cells and their respective grounding terminals correspondingly, and arranged closer to the corresponding FET cells than the third resistor. This makes it possible to appropriately set the gate voltages in accordance with the temperatures of the respective FET cells, and thereby suppress thermal runaway even when the plurality of FET cells are connected in parallel.

Other and further objects, features and advantages of the invention will appear more fully from the following description.

DESCRIPTION OF EMBODIMENTS

A power amplifier according to the embodiments of the present invention will be described with reference to the drawings. The same components will be denoted by the same symbols, and the repeated description thereof may be omitted.

First Embodiment

Figure 1:
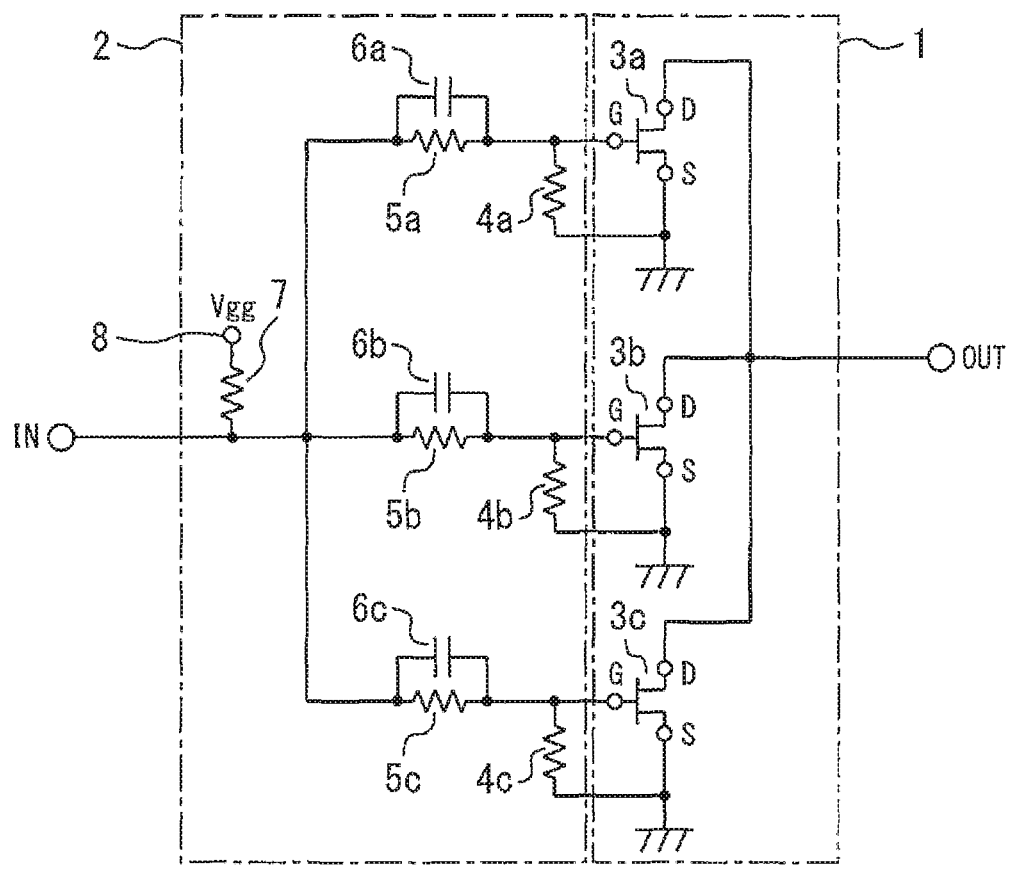
FIG. 1 is a circuit diagram illustrating a power amplifier according to a first embodiment of the present invention.

FIG. 1 is a circuit diagram illustrating a power amplifier according to a first embodiment of the present invention. An FET 1 is, for example, a GaN HEMT device or an FET made of GaAs. The FET 1 includes a plurality of FET cells 3a, 3b and 3c connected in parallel to each other. Each FET cell includes N unit FETs combined in parallel. Each FET cell 3a, 3b or 3c is source-grounded. Each drain terminal is connected to an output terminal OUT. A gate bias circuit 2 is connected to a gate terminal of each FET cell 3a, 3b or 3c.

In the gate bias circuit 2, each resistor 4a, 4b or 4c is connected between gate terminals of the FET cell 3a, 3b or 3c and grounding terminals, respectively. The grounding terminals are terminals to ground the power amplifier according to the present first embodiment. One ends of resistors 5a, 5b and 5c are connected to the gate terminals of the FET cells 3a, 3b and 3c, respectively and other ends thereof are connected to each other. A connection point of the other ends of the resistors 5a, 5b and 5c is connected to an input terminal IN to which an RF signal is inputted. Capacitors 6a, 6b and 6c are connected in parallel to the resistors 5a, 5b and 5c, respectively. The capacitors 6a, 6b and 6c have capacitance values close to those of short circuit at their operating frequencies and bypass an RF signal.

A resistor 7 is connected between the connection point of the other ends of the resistors 5a, 5b and 5c, and a power supply terminal 8. Here, the power supply terminal 8 is a terminal to connect the power amplifiers according to the present first embodiment to an external power supply, and when a negative voltage Vgg is applied to the power supply terminal 8, a gate voltage is supplied to the gate terminal of each FET cell 3a, 3b or 3c. The resistors are made up of metal resistors, the capacitors are made up of MIMs, and these are integrated as an MMIC.

The resistors 4a, 4b and 4c have temperature coefficients of resistance greater than those of the resistors 5a, 5b and 5c and the resistor 7, and are arranged closer to the corresponding FET cells 3a, 3b and 3c than the resistor 7.

Figure 2:
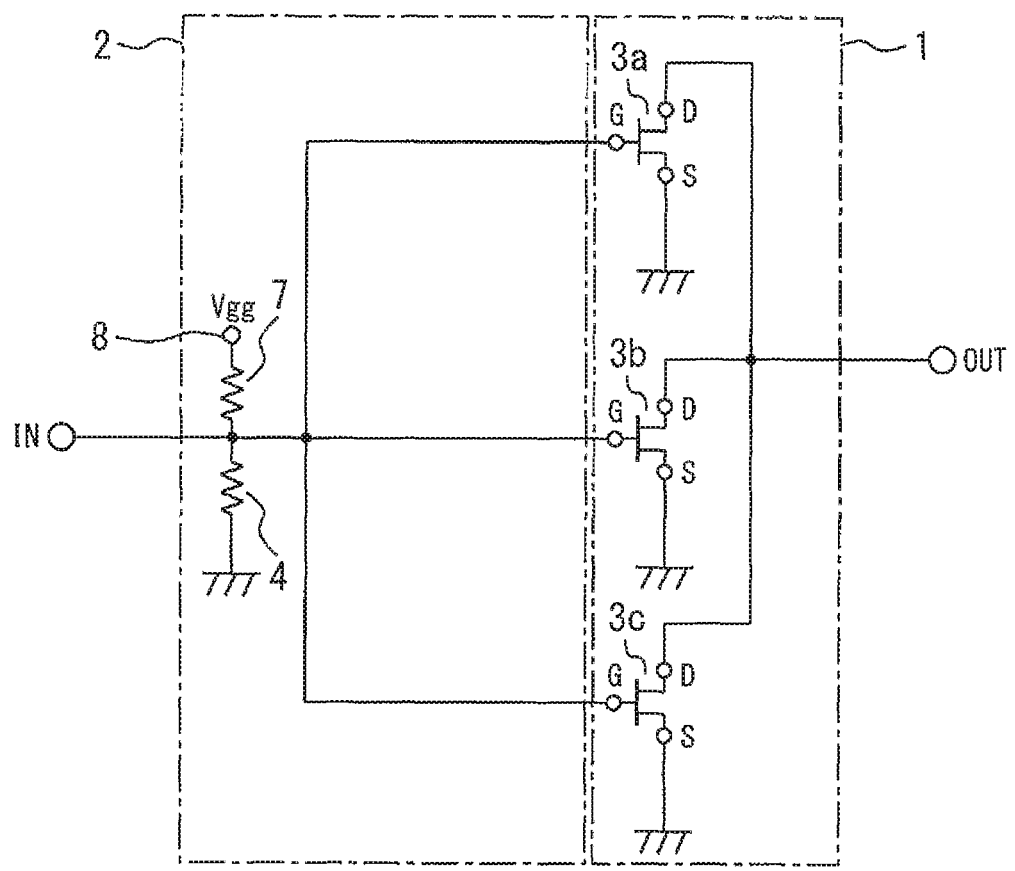
FIG. 2 is a circuit diagram illustrating a power amplifier according to a comparative example.

Next, the effects of the present embodiment will be described in comparison with a comparative example. FIG. 2 is a circuit diagram illustrating a power amplifier according to a comparative example. In the comparative example, one resistor 4 is connected between a combination of gate terminals of a plurality of FET cells 3a, 3b and 3c and a grounding terminal. The resistor 4 is disposed spaced apart from the FET cells 3a, 3b and 3c as in the case of the resistor 7.

Figure 3:
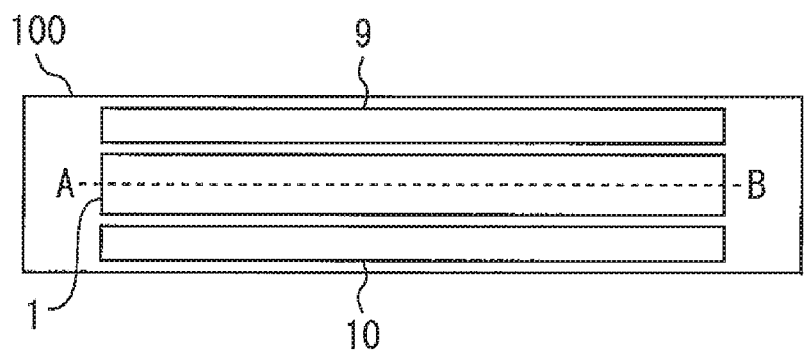
FIG. 3 is a plan view illustrating an FET chip in which a plurality of FET cells are connected in parallel.

FIG. 3 is a plan view illustrating an FET chip in which a plurality of FET cells are connected in parallel. A drain pad 9 and a gate pad 10 are provided on a semiconductor substrate 100 so as to sandwich an elongated FET 1. Both ends of the FET 1 are assumed to be A and B, respectively.

Figure 4:
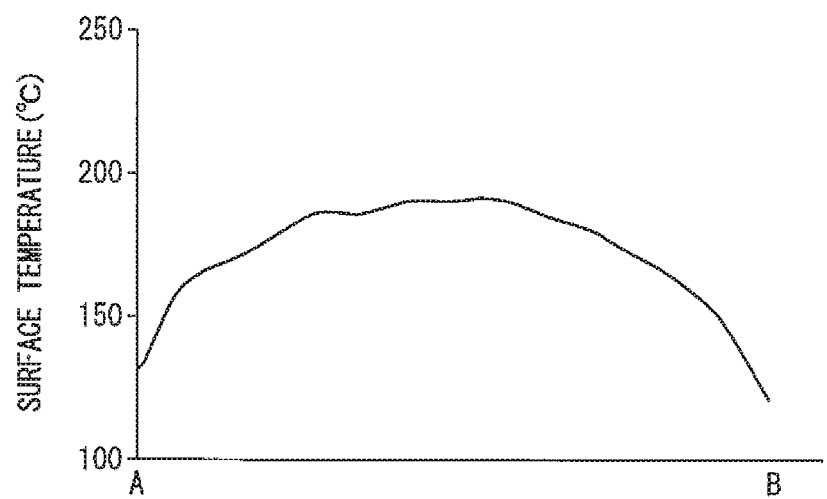
FIG. 4 is a diagram illustrating an evaluation result of an operating temperature at a certain temperature of a case in the comparative example.

FIG. 4 is a diagram illustrating an evaluation result of an operating temperature at a certain temperature of a case in the comparative example. A comparison between a temperature near the center of the FET and temperatures at both ends A and B shows that there is a difference of approximately 50° C. This is attributable to the fact that heat dissipation near the center is poorer than that at both ends. For this reason, the FET cell near the center is most likely to produce thermal runaway.

In the comparative example, the resistor 4 connected between the gate terminals and the grounding terminal compensates gate voltages with respect to temperatures, but the gate voltages with respect to the respective FET cells 3a, 3b and 3c are the same. Therefore, setting a large amount of reduction of the gate voltage with respect to a temperature rise is set to suppress thermal runaway of the center FET cell 3b results in excessive compensation for the FET cells 3a and 3c at both ends.

In contrast, in the present embodiment, since the resistors 4a, 4b and 4c are arranged at points closest to the respective FET cells 3a, 3b and 3c, the resistance values of the resistors 4a, 4b and 4c change according to heat generation of the respective FET cells 3a, 3b and 3c. Therefore, the resistor 4b corresponding to the FET cell 3b at the center that results in a high temperature exhibits a relatively large resistance value, whereas the resistors 4a and 4c corresponding to the FET cells 3a and 3c at both ends exhibit relatively small resistance values. On the other hand, since the resistor 7 is disposed spaced apart from the FET cells 3a, 3b and 3c, it is hardly susceptible to heat generated at the FET cells 3a, 3b and 3c. Furthermore, since the resistors 5a, 5b and 5c are connected in series to the gate terminals of the respective FET cells 3a, 3b and 3c, different gate voltages are applied to the respective FET cells 3a, 3b and 3c. At this time, the gate voltages applied to the respective FET cells 3a, 3b and 3c depend on the resistance values of the resistors 4a, 4b and 4c. For this reason, the gate voltage of the FET cell 3b at the center is set to be relatively low and the gate voltages of the FET cells 3a and 3c at both ends are set to be relatively high.

Figure 5:
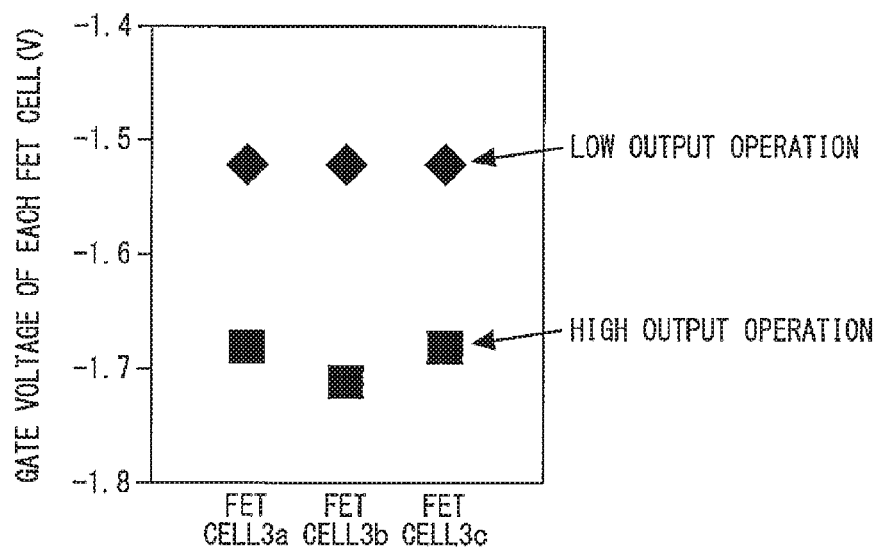
FIG. 5 is a diagram illustrating calculation results of the gate voltages of the respective FET cells of the first embodiment of the present invention.

FIG. 5 is a diagram illustrating calculation results of the gate voltages of the respective FET cells of the first embodiment of the present invention. Vgg is −2.5 V, the resistance values of the resistors 4a, 4b and 4c are 500Ω, the resistance values of the resistors 5a, 5b and 5c are 300Ω, the resistance value of the resistor 7 is 10Ω, the capacitance values of the capacitors 6a, 6b and 6c are 12 pF, the temperature coefficients of resistance of the resistors 4a, 4b and 4c are +2000 ppm. Furthermore, the resistors 4a, 4b and 4c are assumed to exhibit resistance values corresponding to operating temperatures of the respective FET cells. Moreover, during a low output operation, the operating temperatures of the respective FET cells are assumed to be 25° C. and the temperature difference is assumed to be sufficiently small. Therefore, the gate voltages of the respective FET cells are all −1.52 V. On the other hand, during a high output operation, an operating temperature difference is produced depending on the position of each FET cell as described above. Here, the operating temperatures of the FET cells 3a and 3c are assumed to be 200° C. and the operating temperature of the FET cell 3b is assumed to be 250° C. It is apparent from the calculation results that the gate voltages of the FET cells 3a and 3c having low operating temperatures are −1.68 V, whereas the gate voltage of the FET cell 3b having a high operating temperature is −1.71 V, that is, a lower gate voltage is set.

As described above, in the present embodiment, the resistors 4a, 4b and 4c having greater temperature coefficients of resistance than the resistors 5a, 5b and 5c, and the resistor 7 are connected between the gate terminals of the FET cells 3a, 3b, and 3c, and their respective grounding terminals correspondingly, and arranged closer to the corresponding FET cells 3a, 3b and 3c than the resistor 7. This makes it possible to appropriately set the gate voltages in accordance with the temperatures of the respective FET cells 3a, 3b and 3c, and thereby suppress thermal runaway even when the plurality of FET cells 3a, 3b and 3c are connected in parallel.

Note that the temperature coefficients of the resistors 4a, 4b and 4c are preferably set in accordance with the temperature dependency of the gate leakage current of the FET 1. When the temperature dependency of the gate leakage current of the FET 1 is large, the gate voltage rise due to a temperature rise is also large, and therefore the temperature coefficient among the resistors 4a, 4b and 4c needs also be set to a large value. Furthermore, when the temperature difference according to the positions of the FET cells 3a, 3b and 3c is large, the gate voltage difference among the respective FET cells 3a, 3b and 3c needs to be set to a large value. In this case, by setting the resistance values of the resistors 5a, 5b and 5c to be greater than the resistance values of the resistors 4a, 4b and 4c, it is possible to increase the potential difference among the gate terminals of the respective FET cells 3a, 3b and 3c.

Second Embodiment

In the first embodiment, only the resistors 4a, 4b and 4c are arranged at positions closest to the FET cells 3a, 3b and 3c. In contrast, in the present embodiment, the resistors 5a, 5b and 5c are epitaxial layer resistors that have negative temperature coefficients of resistance smaller than the temperature coefficient of the resistor 7 and are arranged closer to the corresponding FET cells 3a, 3b and 3c than the resistor 7.

At a high temperature, the gate leakage current increases and flows into the resistors 5a, 5b and 5c, causing the gate voltages of the FET cells 3a, 3b and 3c to increase. However, in the present embodiment, since the resistance values of the resistors 5a, 5b and 5c decrease at a high temperature, it is possible to suppress increases in the gate voltages. Furthermore, when there is a temperature difference among the FET cells 3a, 3b and 3c, the resistor 5b connected to the FET cell 3b which has a higher temperature exhibits a smaller resistance value than those of the resistors 5a and 5c, and therefore the gate voltage of the FET cell 3b is set to be lower than those of the FET cells 3a and 3c. As a result, it is possible to suppress thermal runaway more reliably than the first embodiment.

Furthermore, the resistors 5a, 5b and 5c are epitaxial layer resistors. While a temperature coefficient of a metal resistor is determined substantially by its material, the temperature coefficient of resistance of the epitaxial layer resistor is changed according to an epitaxial layer concentration, and it is thereby possible to obtain a desired temperature coefficient. Therefore, it is possible to widen a range of adjustment of the gate voltages of the respective FET cells 3a, 3b and 3c with respect to the temperature changes of the FET cells 3a, 3b and 3c.

Note that the resistors 5a, 5b and 5c may be configured to include metal resistors having positive temperature coefficients of resistance and epitaxial layer resistors connected in series to the metal resistors and having negative temperature coefficients of resistance. This makes it possible to obtain a desired temperature coefficient by changing the respective resistance ratios.

Third Embodiment

Figure 6:
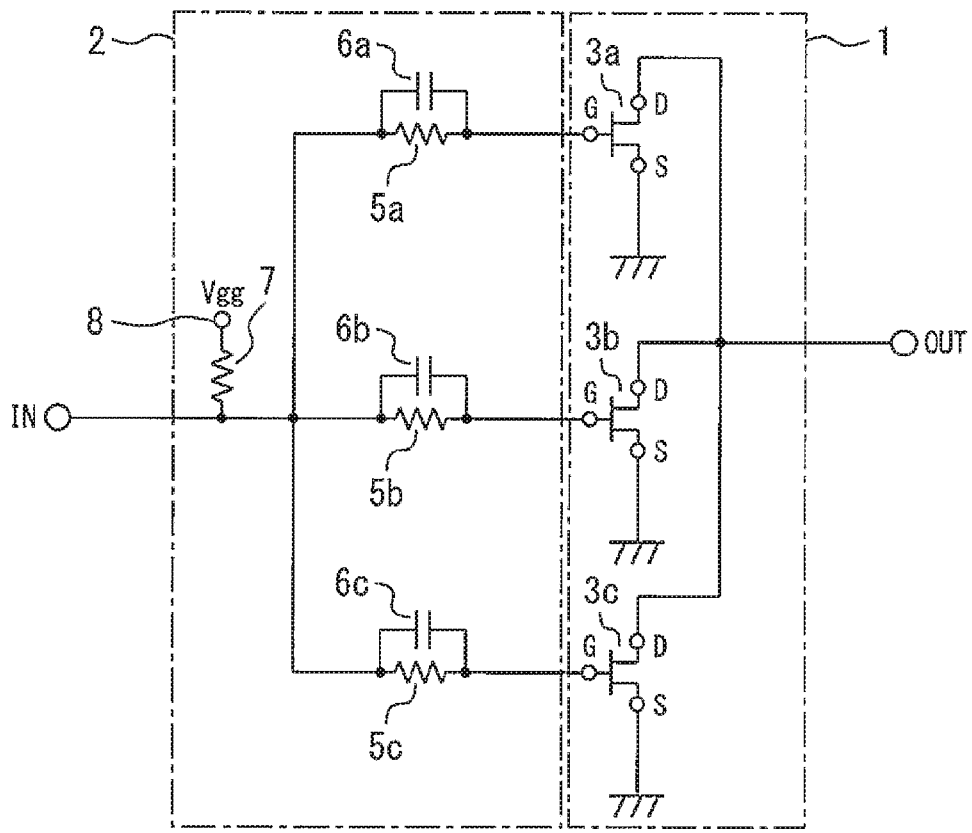
FIG. 6 is a circuit diagram illustrating a power amplifier according to a third embodiment of the present invention.

FIG. 6 is a circuit diagram illustrating a power amplifier according to a third embodiment of the present invention. Unlike the first embodiment, there are no resistors 4a, 4b and 4c. Furthermore, the resistors 5a, 5b and 5c are epitaxial layer resistors having negative temperature coefficients of resistance smaller than the temperature coefficient of the resistor 7, and are arranged closer to the FET cells 3a, 3b and 3c than the resistor 7. The rest of the configuration is the same as that of the first embodiment.

As the temperature of the FET 1 increases, the gate leakage current increases accordingly, but the resistance values of the resistors 5a, 5b and 5c connected to the gate terminals decrease, causing the gate voltage to decrease. For this reason, it is possible to suppress thermal runaway at a high temperature. Furthermore, since the gate voltages can be set appropriately in accordance with the temperatures of the respective FET cells 3a, 3b and 3c, it is possible to suppress thermal runaway even when a plurality of FET cells 3a, 3b and 3c are connected in parallel. Furthermore, since the resistors 4a, 4b and 4c become unnecessary, it is possible to downsize the apparatus more than in the first embodiment.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-006192, filed on Jan. 15, 2016 including specification, claims, drawings and summary, on which the Convention priority of the present application is based, is incorporated herein by reference in its entirety.

The invention claimed is:

1. A power amplifier comprising:
   a plurality of FET cells connected in parallel to each other;
   a plurality of first resistors connected between gate terminals of the plurality of FET cells and grounding terminals respectively;
   a plurality of second resistors having one ends connected to the gate terminals of the plurality of FET cells respectively and other ends connected to each other;
   a plurality of capacitors connected in parallel to the plurality of second resistors respectively; and
   a third resistor connected between a connection point of the other ends of the plurality of second resistors and a power supply terminal,
   wherein the first resistors have temperature coefficients of resistance greater than those of the second and third resistors and are arranged closer to the corresponding FET cells than the third resistor.

2. The power amplifier of claim 1, wherein the second resistors have negative temperature coefficients of resistance and are arranged closer to the corresponding FET cells than the third resistor.

3. The power amplifier of claim 2, wherein the second resistors include metal resistors having positive temperature coefficients of resistance and epitaxial layer resistors connected in series to the metal resistors and having negative temperature coefficients of resistance.

4. A power amplifier comprising:
   a plurality of FET cells connected in parallel to each other;
   a plurality of first resistors having one ends connected to gate terminals of the plurality of FET cells respectively and other ends connected to each other;
   a plurality of capacitors connected in parallel to the plurality of first resistors respectively; and
   a second resistor connected between a connection point of the other ends of the plurality of first resistors and a power supply terminal,
   wherein the first resistors have temperature coefficients of resistance greater than that of the second resistor and are arranged closer to the corresponding FET cells than the second resistor.

* * * * *